US006485889B1

(12) United States Patent
Verschueren

(10) Patent No.: US 6,485,889 B1
(45) Date of Patent: Nov. 26, 2002

(54) METHOD FOR OBTAINING A HEAT SENSITIVE ELEMENT BY SPRAY-COATING

(75) Inventor: Eric Verschueren, Merksplas (BE)

(73) Assignee: Agfa-Gevaert, Mortsel (BE)

( * ) Notice: Subject to any disclaimer, the term of this patent is extended or adjusted under 35 U.S.C. 154(b) by 80 days.

(21) Appl. No.: 09/659,690

(22) Filed: Sep. 11, 2000

Related U.S. Application Data

(60) Provisional application No. 60/155,771, filed on Sep. 27, 1999.

(30) Foreign Application Priority Data

Sep. 15, 1999 (EP) ............................................ 99203064

(51) Int. Cl.[7] .................................................. G03F 7/16

(52) U.S. Cl. .................... 430/302; 430/270.1; 430/964; 101/463.1

(58) Field of Search ............................ 430/302, 270.1, 430/964; 101/463.1

(56) References Cited

U.S. PATENT DOCUMENTS

| | | | | | |
|---|---|---|---|---|---|
| 3,861,955 | A | * | 1/1975 | Lemelson | 117/235 |
| 3,937,175 | A | * | 2/1976 | Horner | 118/7 |
| 4,081,577 | A | * | 3/1978 | Horner | 427/424 |
| 4,626,484 | A | | 12/1986 | Nishioka et al. | |
| 4,781,941 | A | * | 11/1988 | Inukai et al. | 427/27 |
| 5,481,084 | A | * | 1/1996 | Patrick et al. | 219/123 |
| 5,496,677 | A | * | 3/1996 | Toyama et al. | 430/162 |
| 5,713,287 | A | | 2/1998 | Gelbart | |
| 5,798,019 | A | * | 8/1998 | Cushner et al. | 156/425 |
| 5,837,425 | A | * | 11/1998 | Nakanishi et al. | 430/302 |
| 5,916,403 | A | * | 6/1999 | Cushner et al. | 156/244.13 |
| 6,083,571 | A | * | 7/2000 | Kapfinger | 427/555 |
| 2001/0008104 | A1 | * | 7/2001 | Verschueren et al. | 101/463.1 |
| 2001/0008105 | A1 | * | 7/2001 | Verschueren et al. | 101/463.1 |
| 2001/0013297 | A1 | * | 8/2001 | Verschueren | 101/483 |
| 2002/0031724 | A1 | * | 3/2002 | Verschueren et al. | 430/302 |
| 2002/0072013 | A1 | * | 6/2002 | Vander Aa | 430/302 |

FOREIGN PATENT DOCUMENTS

| | | | | | |
|---|---|---|---|---|---|
| EP | 0 770 495 | A1 | * | 5/1997 | |
| EP | 0 818 711 | A2 | | 1/1998 | |
| EP | 0 818 711 | A3 | | 4/1998 | |
| EP | 0 849 091 | A1 | | 6/1998 | |
| EP | 1 084 830 | A1 | * | 3/2001 | B41C/1/10 |
| EP | 1 084 862 | A1 | * | 3/2001 | B41M/5/36 |

* cited by examiner

*Primary Examiner*—Janet Baxter
*Assistant Examiner*—Barbara Gilliam
(74) *Attorney, Agent, or Firm*—Breiner & Breiner, L.L.C.

(57) ABSTRACT

According to the present invention there is provided a method for obtaining a high quality printing plate by spraying a spray solution on a receiving surface of grained and anodized aluminum, characterized in that the spray factor (SF) is between 48 and 70 10 mN/m, wherein $SF=(P/d\times\sigma)$ SF: Spray Factor (mN/m)

P: Spray Profile (mm)

d: distance between spray head and receiving surface (mm)

$\sigma$: surface tension (mN/m)

and wherein the spray solution comprises hydrophobic thermoplastic polymer particles and a compound capable of converting light into heat.

6 Claims, No Drawings

METHOD FOR OBTAINING A HEAT SENSITIVE ELEMENT BY SPRAY-COATING

This application claims the benefit of provisional application No. 60/155,771, filed Sep. 27, 1999.

FIELD OF THE INVENTION

The present invention relates to a method for preparing a heat sensitive element by spray coating.

BACKGROUND OF THE INVENTION.

Lithography is the process of printing from specially prepared surfaces, some areas of which are capable of accepting lithographic ink, whereas other areas, when moistened with water, will not accept the ink. The areas that accept ink form the printing image areas and the ink-rejecting areas form the background areas.

In the art of photolithography, a photographic material is made image-wise receptive to oily or greasy ink in the photo-exposed (negative working) or in the non-exposed areas (positive working) on a hydrophilic background.

In the production of common lithographic plates, also called surface litho plates or planographic printing plates, a support that has affinity to water or obtains such affinity by chemical treatment is coated with a thin layer of a photosensitive composition. Coatings for that purpose include light-sensitive polymer layers containing diazo compounds, dichromate-sensitized hydrophilic colloids and a large variety of synthetic photopolymers. Particularly diazo-sensitized systems are widely used.

Upon image-wise exposure of the light-sensitive layer the exposed image areas become insoluble and the unexposed areas remain soluble. The plate is then developed with a suitable liquid to remove the diazonium salt or diazo resin in the unexposed areas.

On the other hand, methods are known for making printing plates involving the use of imaging elements that are heat sensitive rather than photosensitive. A particular disadvantage of photosensitive imaging elements such as described above for making a printing plate is that they have to be shielded from the light. Furthermore they have a problem of sensitivity in view of the storage stability and they show a lower resolution. The trend towards heat sensitive printing plate precursors is clearly seen on the market.

For example, Research Disclosure no. 33303 of Jan. 1992 discloses a heat sensitive imaging element comprising on a support a cross-linked hydrophilic layer containing thermoplastic polymer particles and an infrared absorbing pigment such as e.g. carbon black. By image-wise exposure to an infrared laser, the thermoplastic polymer particles are image-wise coagulated thereby rendering the surface of the imaging element at these areas ink acceptant without any further development. A disadvantage of this method is that the printing plate obtained is easily damaged since the non-printing areas may become ink accepting when some pressure is applied thereto. Moreover, under critical conditions, the lithographic performance of such a printing plate may be poor and accordingly such printing plate has little lithographic printing latitude.

EP-A-514 145 discloses a heat sensitive imaging element including a coating comprising core-shell particles having a water insoluble heat softenable core component and a shell component which is soluble or swellable in aqueous alkaline medium. Red or infrared laser light directed image-wise at said imaging element causes selected particles to coalesce, at least partially, to form an image and the non-coalesced particles are then selectively removed by means of an aqueous alkaline developer. Afterwards a baking step is performed. However the printing endurance of a so obtained printing plate is low.

EP-A-599 510 discloses a heat sensitive imaging element which comprises a substrate coated with (i) a layer which comprises (1) a disperse phase comprising a water-insoluble heat softenable component A and (2) a binder or continuous phase consisting of a component B which is soluble or swellable in aqueous, preferably aqueous alkaline medium, at least one of components A and B including a reactive Croup or precursor therefor, such that insolubilization of the layer occurs at elevated temperature and/or on exposure to actinic radiation, and (ii) a substance capable of strongly absorbing radiation and transferring the energy thus obtained as heat to the disperse phase so that at least partial coalescence of the coating occurs. After image-wise irradiation of the imaging element and developing the image-wise irradiated plate, said plate is heated and/or subjected to actinic irradiation to effect insolubilization. However the printing endurance of a so obtained printing plate is low.

EP-A-625 728 discloses an imaging element comprising a layer which is sensitive to UV- and IR-irradiation and which can be positive or negative working. This layer comprises a resole resin, a novolac resin, a latent Bronsted acid and an IR-absorbing substance. The printing results of a lithographic plate obtained by irradiating and developing said imaging element are poor.

U.S. Pat. No. 5,340,699 is almost identical with EP-A-625 728 but discloses the method for obtaining a negative working IR-laser recording imaging element. The IR-sensitive layer comprises a resole resin, a novolac resin, a latent Bronsted acid and an IR-absorbing substance. The printing results of a lithographic plate obtained by irradiating and developing said imaging element are poor.

U.S. Pat. No. 4,708, 925 discloses a positive working imaging element including a photosensitive composition comprising an alkali-soluble novolac resin and an onium-salt. This composition can optionally contain an IR-sensitizer. After image-wise exposing said imaging element to UV—visible—or eventually IR-radiation followed by a development step with an aqueous alkali liquid there is obtained a positive working printing plate. The printing results of a lithographic plate obtained by irradiating and developing said imaging element are poor.

EP-A-96 200 972.6 discloses a heat sensitive imaging element comprising on a hydrophilic surface of a lithographic base an image forming layer comprising hydrophobic thermoplastic polymer particles dispersed in a water insoluble alkali soluble or swellable resin and a compound capable of converting light into heat, said compound being present in said image forming layer or a layer adjacent thereto, wherein said alkali swellable or soluble resin comprises phenolic hydroxy groups and/or carboxyl groups. However by exposure with short pixel times of said heat-sensitive imaging element there occurs ablation on the exposed areas resulting in an insufficient ink acceptance.

Analogous imaging elements comprising on a hydrophilic surface of a lithographic base an image forming layer comprising hydrophobic thermoplastic polymer particles dispersed in a water or alkali soluble or swellable resin and a compound capable of converting light into heat, said compound being present in said image forming layer or a layer adjacent thereto are disclosed in e.g. EP-A-770 494, EP-A-770 495, EP-A-770 496, EP-A-770 497, EP-A-773 112, EP-A-773 113, EP-A-774 364, EP-A-800 928, EP-A-96 202 685, EP-A-96 203 003, EP-A-96 203 004 and EP-A-96 203 633. In most of these applications poly(meth) acrylate latices are used as thermoplastic polymer particles and no specific hydrophilic resin is mentioned In most cases carbon black or an IR-dye are mentioned as the compound capable of converting light into heat.

In order to prepare an imaging element as described above, that is processable on the press, preferably IR-dyes should be used. Carbon black causes indeed a soiling on the press when removing the unexposed areas. On the other hand when using IR-dyes the unexposed areas are not completely dissolved when developing on the press resulting in scumming.

The appliance of the coatings which are used at the preparation of lithographic precursor plates happens mostly with coating techniques such as dipcoating, cascade coating and curtain coating. The use of spray techniques for applying lithographic layers fails usually at the attainable level of cosmetic quality of the end product. The conditions for high qualitative lithographic materials (thermal printing plates well or not processable on press) whereat high resolution, sensitivity and reproducing characteristics are required, are very high with relation with the cosmetic quality of said printing plate. This cosmetic quality can be translated as the presence of lines, the general evenness and the presence of a mottle pattern. This mottle pattern appears at the slightest presence clearly in the printing process of large screen planes.

OBJECTS OF THE INVENTION

It is an object of the present invention to provide the necessary parameters for obtaining a spray-coated layer with excellent cosmetic quality.

SUMMARY OF THE INVENTION

According to the present invention there is provided a method for obtaining a high quality printing plate by spraying a spray solution on a receiving surface of grained and anodized aluminum, characterized in that the spray factor (SF) is between 48 and 70 mN/m, wherein $SF=(P/d\times\sigma)$ SF: Spray Factor (mN/m)

P: Spray Profile (mm)

d: distance between spray head and receiving surface (mm)

$\sigma$: surface tension (nN/m).

DETAILED DESCRIPTION OF THE INVENTION

To define the spray profile, under well-defined settings from solution and hardware , during 1 pass of the rotating drum, a line is sprayed without transverse movement of the spray head. To obtain the right spray pattern, as substrate a well swelling receiving layer, comprising gelatin, polyvinylpyrrolidone and polyethylene glycol ( Agfajet Photograde paper HP Glossy 165™, commercially available from Agfa-Gevaert) was used. This results in an immediate freezing of the spray pattern without the possibility of transverse flowing of the spray solution over the receiving surface. From this line, with the use of microdensitometry, the density profile of the line is measured. In the next step, the width at half height of this profile is divided by the total height (the maximum density) of the profile. This value is referred as profile value (P).

This profile value is determined by the air pressure of the spraying head, by the flow rate of the spraying head and by the nature of the receiving surface.

This value lies preferably between 50 and 220 mm although this value has to be considered in the context of the given equation. The surface tension of the spray solution lies preferably between 22 mN/m and 60 mN/m.

The distance between the spray head and the receiving member lies preferably between 25 and 100 mm.

The spray solution is preferably an aqueous solution, which may comprises surfactants, preferably fluorosurfactants. The viscosity of the spraying solution is preferably at least 1.5 mPa.s.

The receiving surface can be a drum with a hydrophilic surface, which can be incorporated in a printing machine.

The receiving surface can be a lithographic surface mounted on a drum.

The following spray settings results in optimum coating quality:

Drum speed: 200–240 rpm

Distance spray head: 60–100 mm

Flow rate: 6–8 ml/min

Air pressure: $5.17\times10^5$–$7.24\times10^5$ Pa

Number of coatings : 5–7

Speed of spray head 1–2m/min

Drying temperature: 700°C.

Type spray head: air assisted SUJ1

A preferred spraying solution is a dispersion of hydrophobic thermoplastic polymer particles in a hydrophilic binder. Said solution preferably includes thermoplastic particles of a homopolymer or a copolymer of styrene and a hydrophilic polymer containing carboxyl groups, and further a compound capable of converting light into heat. Such solutions, suitable for spraying heat sensitive imaging elements are described with their exposure and development in EP-A-98 200 187.

The receiving element is a lithographic base with a hydrophilic support, namely an anodized roughened aluminum support.

The imaging element, obtained by spraying the spray solution on the receiving element can after exposure to an IR-laser be developed by rinsing the element with an aqueous solution. Preferably the exposed imaging element is mounted directly on the press.

The following examples illustrate the present invention without limiting it thereto. All parts and percentages are by weight unless otherwise specified.

EXAMPLES

Preparation of Spray Solution

Spray Solution A

A 2.61 wt solution in water was prepared by mixing polystyrene latex, dye I and a hydrophilic binder. After spraying and drying, the resulting layer contained 75%W/W of the polystyrene latex, 10% of the dye A and 15% W/W of Glascol E 15™. Glascol E 15 is a polyacrylic acid, commercially available at N.V. Allied Colloids Belgium.

The structure of Dye I is as follows.

(I)

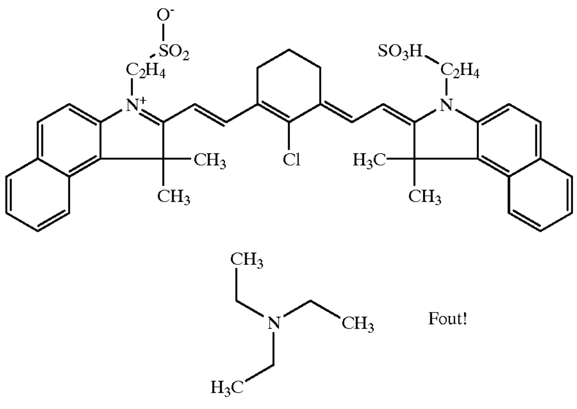

Schakeloptis-instructie niet oppegeven.

Spray Solution B

To spray solution A, 5 ml of a fluorosurfactant was added.

Spray Solution C

To spray solution A, 10 ml of a fluorosurfactant was added.

Example 1

Preparation of the Lithographic Base

A 0.30 mm thick aluminum foil was degreased by immersing the foil in an aqueous solution containing 5 g/l of sodium hydroxide at 50° C. and rinsed with demineralized water. The foil was then electrochemically grained using an alternating current in an aqueous solution containing 4 g/l of hydrochloric acid, 4 g/l of hydroboric acid and 5 g/l of aluminum ions at a temperature of 35° C. and a current density of 1200 $A/m^2$ to form a surface topography with an average center-line roughness Ra of 0.5 $\mu$m.

After rinsing with demineralized water the aluminum foil was then etched with an aqueous solution containing 300 g/l of sulfuric acid at 60° C. for 180 seconds and rinsed with demineralized water at 25° C. for 30 seconds.

The foil was subsequently subjected to anodic oxidation in an aqueous solution containing 200 g/l of sulfuric acid at a temperature of 45° C., a voltage of about 10 V and a current density of 150 $A/m^2$ for about 300 seconds to form an anodic oxidation film of 3.00 $g/m^2$ of $Al_2O_3$, then washed with demineralized water and posttreated with a solution containing polyvinylphosphonic acid and subsequently with a solution containing aluminum trichloride, rinsed with demineralized water at 20° C. during 120 seconds and dried.

Preparation of the Heat-Mode Imaging Element

On above mentioned lithographic base was sprayed spray solution A. Therefore, the lithographic base was mounted on a drum, rotating at a line speed of 164 m/min. The imaging element was coated by a spray nozzle moving in transverse direction at a speed of 1.5 m/min. The spray nozzle was mounted on a distance of 80 mm between nozzle and receiving substrate. The flow rate of the spray solution was set to 7 ml/min. During the spray process an air pressure of $7.58\times10^5$ Pa was used on the spray head. The final coat weight is obtained by sequencely spraying during 6 passes of the spray head. This layer was dried on a temperature of 70° C. during the spraying process and additionally during 30 s.

The spray nozzle was of the type SUJ1, an air assisted spray nozzle, commercially available at Spraying Systems Belgium, Brussels

EXAMPLE 2

The same base was used as described in example 1

Preparation of the Heat-Mode Imaging Element

The same spray solution and procedure was used as described in example 1 except following settings: the flow rate of spray solution was set to 4 ml/min and air pressure was set to $6.21\times10^5$ Pa.

EXAMPLE 3

The same base was used as described in example 1

Preparation of the Heat-Mode Imaging Element

The same spray solution and procedure was used as described in example 1 except following settings: the distance between spray nozzle and receiver was set to 60 mm and air pressure was set to $6.21\times10^5$ Pa.

EXAMPLE 4

The same base was used as described in example 1

Preparation of the Heat-Mode Imaging Element

The same spray solution and procedure was used as described in example 2 except following settings: the flow rate of spray solution was set to 15 ml/min.

EXAMPLE 5

The same base was used as described in example 1

Preparation of the Heat-Mode Imaging Element

The same spray solution and procedure was used as described in example 2 except following settings: the flow rate of spray solution was set to 10 ml/min.

EXAMPLE 6

The same base was used as described in example 1

Preparation of the Heat-Mode Imaging Element

The same spray solution and procedure was used as described in example 3 except following settings: the distance between spray nozzle and receiver was set to 45 mm.

EXAMPLE 7

The same base was used as described in example 1

Preparation of the Heat-Mode Imaging Element

The same spray solution and procedure was used as described in example 3 except following settings: the distance between spray nozzle and receiver was set to 35 mm.

EXAMPLE 8

The same base was used as described in example 1

Preparation of the Heat-Mode Imaging Element

Spray solution B was sprayed following the procedure as described in example 1 except the setting of an air pressure of $6.21\times10^5$ Pa instead of $7.58\times10^5$ Pa.

Example 9

The same base was used as described in example 1

Preparation of the Heat-Mode Imaging Element

Spray solution B was sprayed following the procedure as described in example 8 except the setting of an air pressure of $3.45\times10^5$ Pa instead of $6.21\times10^5$ Pa.

EXAMPLE 10

The same base was used as described in example 1

Preparation of the Heat-Mode Imaging Element

Spray solution B was sprayed following the procedure as described in example 9 except the setting of an air pressure of $4.83 \times 10^5$ Pa instead of $3.45 \times 10^5$ Pa and a reduced distance between spray nozzle and receiver of 70 mm.

EXAMPLE 11

The same base was used as described in example 1 Preparation of the Heat-Mode Imaging Element Spray solution C was sprayed following the procedure as described in example 9.

EXAMPLE 12

The same base was used as described in example 1 Preparation of the Heat-Mode Imaging Element Spray solution C was sprayed following the procedure as described in example 1 with a changed air pressure setting to $4.83 \times 10^5$ Pa.

EXAMPLE 13

The same base was used as described in example 1 Preparation of the Heat-Mode Imaging Element Spray solution C was sprayed following the procedure as described in example 1.

Surface Tension of Spray Solutions

The surface tension of the spray solutions was measured by the common known Wilhelmy plate method. In this method the surface tension is calculated from the measured force to disrupt the contact between a platinum plate and the liquid surface.

| Spray Solution | Surface Tension (σ) |
|---|---|
| A | 56 mN/m |
| B | 34 mN/m |
| C | 27 mN/m |

Calculation of Spray Factor

The spray factor (SF) is calculated by dividing the profile (P) by the distance between spray head and receiver in mm (d), followed by multiplication by the surface tension (σ) of the spray solution.

| Example | P | d | P/d | σ | SF |
|---|---|---|---|---|---|
| 1 | 70 | 80 | 0.875 | 56 | 49.0 |
| 2 | 90 | 80 | 1.125 | 56 | 63.0 |
| 3 | 51 | 60 | 0.844 | 56 | 47.3 |
| 4 | 103 | 80 | 1.288 | 56 | 72.1 |
| 5 | 55 | 80 | 0.688 | 56 | 38.5 |
| 6 | 38 | 45 | 0.833 | 56 | 46.7 |
| 7 | 157 | 35 | 4.485 | 56 | 251.2 |
| 8 | 124 | 80 | 1.550 | 34 | 52.7 |
| 9 | 91 | 80 | 1.137 | 34 | 38.6 |
| 10 | 57.75 | 60 | 0.962 | 34 | 32.7 |
| 11 | 144 | 80 | 1.800 | 27 | 48.6 |
| 12 | 190 | 80 | 2.375 | 27 | 64.1 |
| 13 | 269 | 80 | 3.362 | 27 | 90.7 |

Cosmetic Quality

The plates after spraying and drying are inspected visually and given a quotation in respect to the occurrence of lines, uniformity level and mottle behavior In this procedure, the lower the value, the better the quality. A value of 0 represents a perfect quality. On the other hand a value of 5 represents a very bad quality.

For both the occurrence of lines and for uniformity, a value of 1 is still acceptable. For the mottle behavior a value of 1 is unacceptable since this mottle is visualized in large screen planes printing process.

| | | Cosmetic Quality | | |
|---|---|---|---|---|
| Example | SF | Lines | Uniformity | Mottle |
| 1 | 49.0 | 1 | 0.5 | 0.5 |
| 2 | 63.0 | 0.5 | 1 | 0 |
| 3 | 47.3 | 2 | 1 | 0 |
| 4 | 72.1 | 3 | 3 | 4 |
| 5 | 38.5 | 0.5 | 0.5 | 2 |
| 6 | 46.7 | 3 | 1 | 1 |
| 7 | 251.2 | 3 | 1 | 0 |
| 8 | 52.7 | 0.5 | 0 | 0 |
| 9 | 38.6 | 1 | 1 | 1 |
| 10 | 32.7 | 2 | 1 | 1 |
| 11 | 48.6 | 0.5 | 0.5 | 0.5 |
| 12 | 64.1 | 0.5 | 0 | 0.5 |
| 13 | 90.7 | 1 | 0.5 | 1 |

What is claimed is:

1. A method for obtaining a high quality printing plate by spraying a spray solution on a receiving surface of grained and anodized aluminum, wherein the spray factor (SF) is between 48 and 70 mN/m, wherein $$SF=(P/d \times \sigma)$$

SF: Spray Factor (mN/m)

P: Spray Profile (mm)

d: distance between spray head and receiving surface (mm)

σ: surface tension (mN/m)

and wherein the spray solution comprises hydrophobic thermoplastic polymer particles and a compound capable of converting light into heat.

2. A method according to claim 1 wherein the spray solution is an aqueous solution.

3. A method according to claim 1 wherein the said solution comprises a hydrophilic binder.

4. A method according to claim 1 wherein the receiving material is a drum with a grained and anodized aluminum surface, capable of being incorporated in a printing machine.

5. A method according to claim 1 wherein the receiving surface is a grained and anodized aluminum surface mounted onto a drum.

6. A method according to claim 1 wherein the spray solution has a viscosity of at least 1.5 mpa.s.

* * * * *

UNITED STATES PATENT AND TRADEMARK OFFICE

CERTIFICATE OF CORRECTION

PATENT NO. : 6,485,889 B1      
DATED : November 26, 2002
INVENTOR(S) : Eric Verschueren It is certified that error appears in the above-identified patent and that said Letters Patent is hereby corrected as shown below:

Title page,
Item [57], ABSTRACT,
Line 5, "70 10 mN/m," should read -- 70 mN/m, --.

Column 2,
Line 14, "Croup" should read -- group --.
Line 39, "4,708, 925" should read -- 4,708,925 --.

Column 3,
Line 46, "(nN/m)" should read -- (mN/m) --.

Column 4,
Line 30, "1-2m/min" should read -- 1-2 m/min --.
Line 31, "700°C" should read -- 70°C --.

Column 8,
Line 11, "planes printing" should read -- planes in the printing --.
Line 58, "mpa.s" should read -- mPa.s --.

Signed and Sealed this

Eighteenth Day of March, 2003

JAMES E. ROGAN
*Director of the United States Patent and Trademark Office*